(12) United States Patent
Chen et al.

(10) Patent No.: US 7,124,513 B2
(45) Date of Patent: Oct. 24, 2006

(54) THREE WAY LASER INDICATOR (75) Inventors: TN Chen, Taipei (TW); Sheng-Ching Wu, Keelung (TW); Ching-Horng Hsiao, TaiChung (TW)

(73) Assignee: Querton Inc.(TW)

( * ) Notice: Subject to any disclaimer, the term of this patent is extended or adjusted under 35 U.S.C. 154(b) by 301 days.

(21) Appl. No.: 10/793,152

(22) Filed: Mar. 3, 2004

(65) Prior Publication Data

US 2004/0172837 A1 Sep. 9, 2004

(30) Foreign Application Priority Data

Mar. 4, 2003 (TW) ............................... 92203186 U (51) Int. Cl.
*G01C 15/00* (2006.01)
(52) U.S. Cl. .................... 33/286; 33/DIG. 21; 33/276; 33/281
(58) Field of Classification Search ................. 33/286, 33/DIG. 21, 227, 228, 281, 282, 283, 285, 33/290, 276; 356/138, 153, 399–400
See application file for complete search history.

(56) References Cited

U.S. PATENT DOCUMENTS

| | | | | | |
|---|---|---|---|---|---|
| 5,218,770 | A | * | 6/1993 | Toga | ............................ 33/276 |
| 5,307,368 | A | * | 4/1994 | Hamar | ........................ 372/107 |
| 5,790,248 | A | * | 8/1998 | Ammann | ..................... 356/250 |
| 6,065,217 | A | * | 5/2000 | Dong | ............................ 33/290 |
| 6,430,823 | B1 | * | 8/2002 | Seki | ............................. 33/281 |
| 6,568,094 | B1 | * | 5/2003 | Wu | ............................... 33/281 |
| 6,665,331 | B1 | * | 12/2003 | Chien | ......................... 372/109 |
| 6,688,011 | B1 | * | 2/2004 | Gamal et al. | ................. 33/290 |
| 6,763,596 | B1 | * | 7/2004 | Puri et al. | ..................... 33/286 |
| 6,782,034 | B1 | * | 8/2004 | Li | .............................. 372/109 |
| 6,848,188 | B1 | * | 2/2005 | Tacklind et al. | .............. 33/290 |
| 6,909,551 | B1 | * | 6/2005 | Liu et al. | ..................... 359/618 |
| 6,912,792 | B1 | * | 7/2005 | Shareef | ........................ 33/285 |
| 6,922,901 | B1 | * | 8/2005 | Chou et al. | ................... 33/290 |
| 6,931,739 | B1 | * | 8/2005 | Chang et al. | ................. 33/286 |
| 6,931,740 | B1 | * | 8/2005 | Marshall et al. | .............. 33/286 |
| 6,938,350 | B1 | * | 9/2005 | Hersey | ........................ 33/286 |

* cited by examiner

*Primary Examiner*—Diego Gutierrez
*Assistant Examiner*—Amy R. Cohen
(74) *Attorney, Agent, or Firm*—Raymond Sun (57) ABSTRACT

A laser indicator has a laser mechanism having three laser generators generating laser beams perpendicular to each other. Each of the three laser generators is electrically coupled to a separate laser control motor for independent control of the beam of the corresponding laser generator. The laser indicator further includes an adjusting mechanism including a control circuit module, a frame having an adjustment support associated therewith, and a plurality of level control motors disposed in the frame. The laser indicator also includes a laser generator adjuster and tightener.

13 Claims, 9 Drawing Sheets

THREE WAY LASER INDICATOR

BACKGROUND OF THE INVENTION

1. Field of the Invention

The present invention relates to a laser indicator, and in particular, to a three-way laser indicator having an adjusting mechanism and a laser mechanism. The laser mechanism has three laser generators for producing three laser beams perpendicular to one another, with each of the laser generators having an independent controlling motor for adjusting the corresponding laser generator. A fine-tune mechanism can also be provided for tuning the angle of the fixed base of the laser mechanism, and for enhancing the tightness between the fixed base and the housing.

2. Description of the Prior Art

As sciences and technologies change dramatically with each passing day, applications for laser become more extensive. Laser enjoys the advantages of long-distance projection, increased brightness, and clearer indication, and these advantages allow lasers to be suitable for the applications of indication and labeling. For example, laser can be used in a laser pen, a laser indicator, or a laser gun sight, as well as used in a laser leveler for marking reference lines for use in constructions. Aside from simply marking horizontal or vertical lines, laser can also be used to project a crossing laser beam so as to provide layouts for stairways, partitions, or ceilings. However, during planar horizontal or vertical laser calibration, it is still difficult to use lasers to measure an interior angle between two perpendicular walls. Therefore, a three-way laser indicator capable of measuring the linearity in three directions is still needed.

Figure 1A:
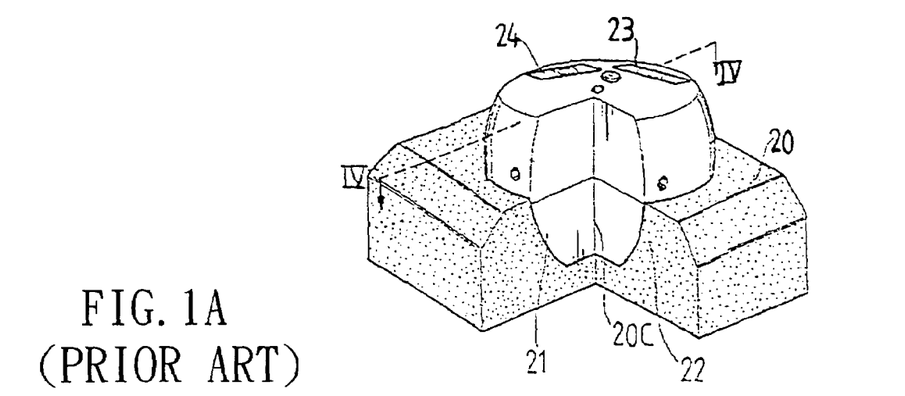
FIG. 1A is a perspective view of a conventional three-way laser linearity measuring instrument.
Figure 1B:
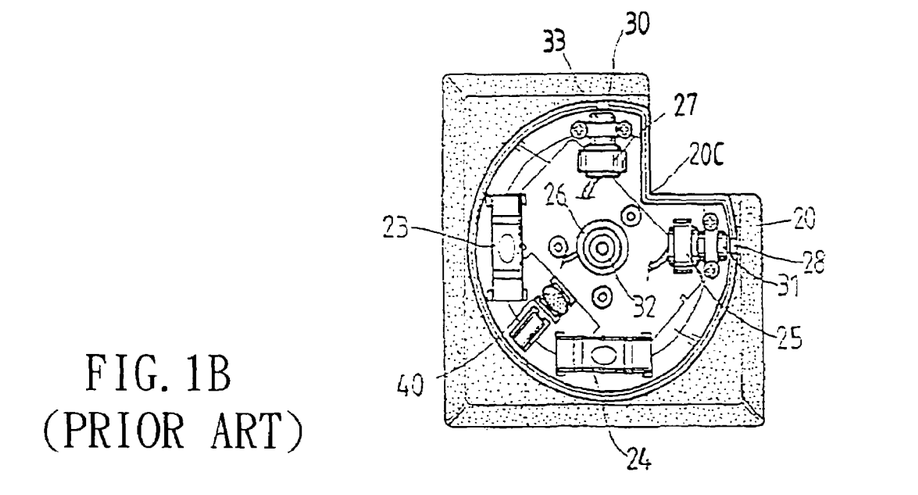
FIG. 1B is a cross-sectional view taken along line IV—IV of FIG. 1.
Figure 1C:
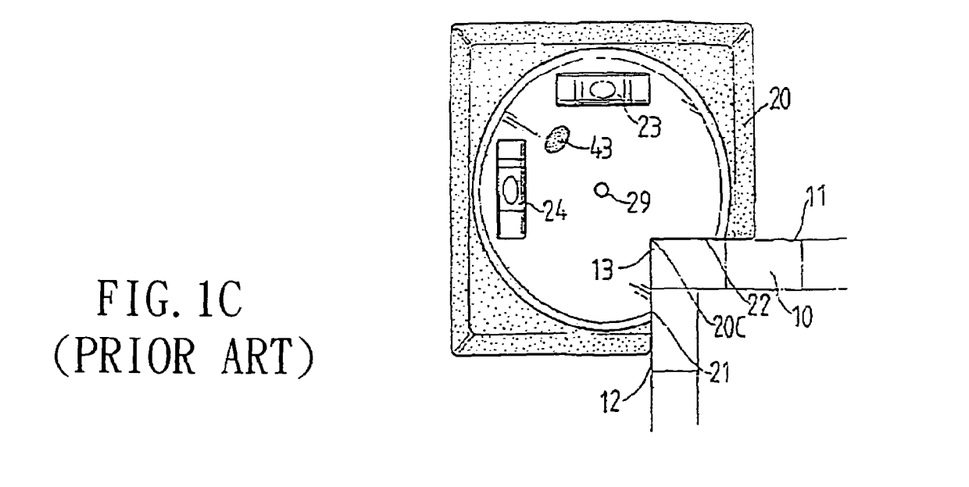
FIG. 1C a top plan view of FIG. 1A.

Referring to FIGS. 1A–1C, R.O.C. (Taiwan) Utility Model Patent Publication No. 38245 entitled "Three-way Laser Measuring Device" illustrates a device having at least three laser generators 31, 32, 33, at least one power supply circuit 40, and a housing 20 for covering all components. The housing 20 has a flat level surface formed at the bottom of the housing 20, a V-shaped opening 20C formed by two perpendicular walls 21, 22 disposed at an appropriate position on the periphery of the housing 20, and a power supply circuit 40 disposed in the housing 20 and connected to the laser generators 31, 32, 33. The laser generators 31, 32, 33 are disposed inside the housing 20, and any two of the laser generators 31, 32, 33 are perpendicular to each other and disposed at a position proximate to the opening 20C, and parallel to the edge of the opening 20C. A through window 28, 29, 30 is positioned at the projecting end of the housing 20 corresponding to each respective laser generator 31, 32, 33, and at least one pair of bubble levelers 23, 24 is embedded in the level surface at the top of the housing 20. The edge of the V-shaped opening 20C is parallel to the bubble levelers 23, 24.

In use, the V-shaped opening 20C is engaged to a wall corner 13 of a building 10 or similar structure that has a corner, with the two perpendicular walls 21, 22 abutting the adjacent wall 12, 11, respectively, of the building 10. Laser beams are projected from the laser generators 31, 32, 33 to achieve the purpose of measuring the linearity in three directions.

However, the structure illustrated in FIGS. 1A–1C has the following shortcomings:

1. The laser generators 31, 32, 33 are mounted into the housing 20 before leaving the factory, so these laser generators 31, 32, 33 cannot be adjusted and may produce an inclination or error after being used for a long time.

2. The laser generators 31, 32, 33 are controlled by only one power supply circuit, so none of the laser generators 31, 32, 33 can function when the circuit fails.

3. The shape of the housing 20 is irregular, not aesthetically pleasing, and not easy to manufacture.

SUMMARY OF THE INVENTION

It is an object of the present invention to provide a laser indicator capable of focusing the laser beam outside the laser generator and providing a three-way horizontal laser measurement.

It is another object of the present invention to provide a laser indicator where each laser generator has an independent motor for adjusting the beam position of each laser generator separately.

It is yet another object of the present invention to provide a laser indicator which has a fixed base with a fine-tune mechanism for tuning the angle of the fixed base and enhancing the tightness between the fixed base and the housing.

It is yet a further object of the present invention to provide a laser indicator having an aesthetically pleasing appearance.

In order to achieve the objectives of the present invention, there is provided a laser indicator having a laser mechanism having three laser generators generating laser beams perpendicular to each other. Each of the three laser generators is electrically coupled to a separate laser control motor for independent control of the beam of the corresponding laser generator. The laser indicator further includes an adjusting mechanism including a control circuit module, a frame having an adjustment support associated therewith, and a plurality of level control motors disposed in the frame. The laser indicator further includes a laser generator adjuster and tightener.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 2:
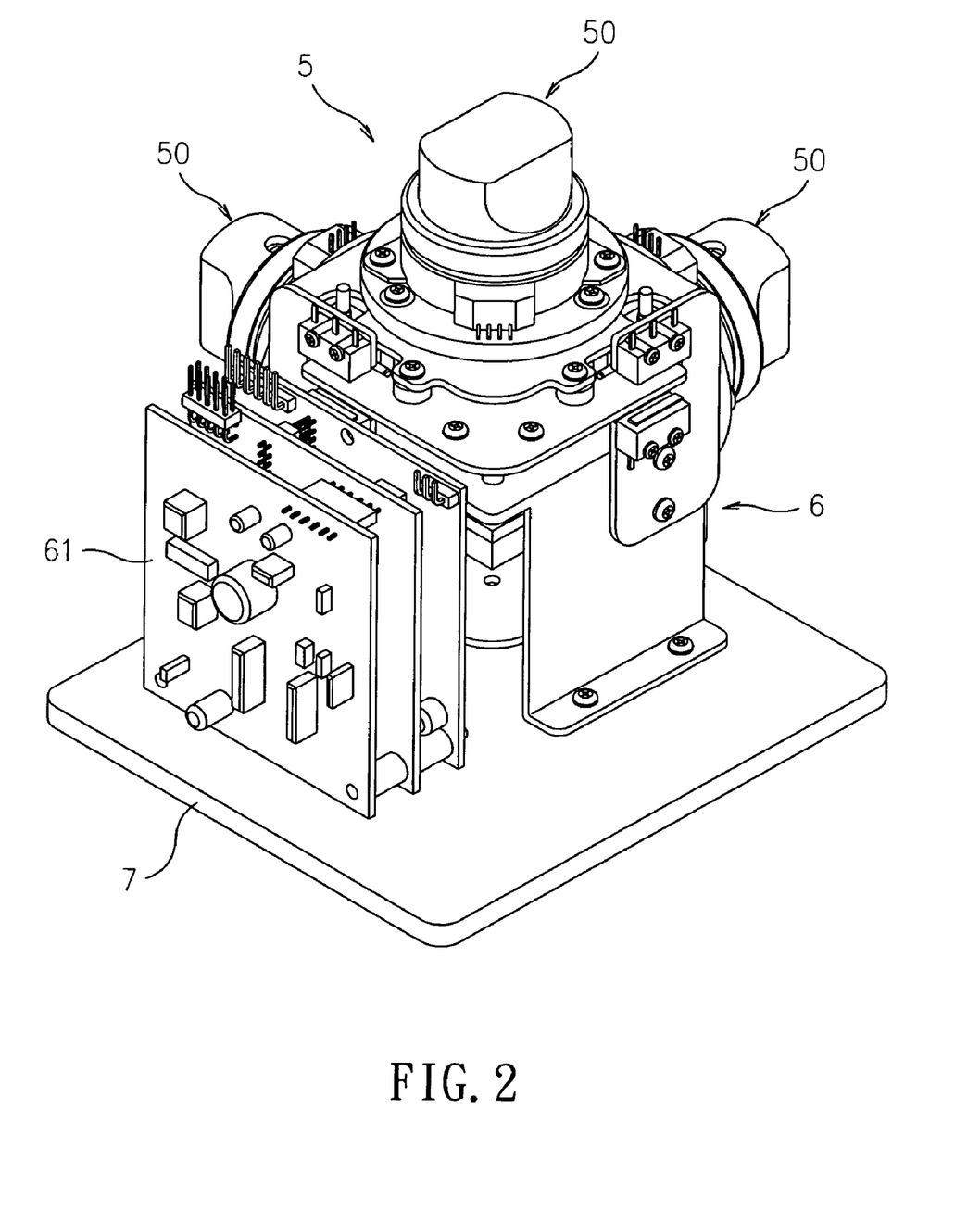
FIG. 2 is a perspective view of the three-way laser indicator according to one embodiment of the present invention.
Figure 3:
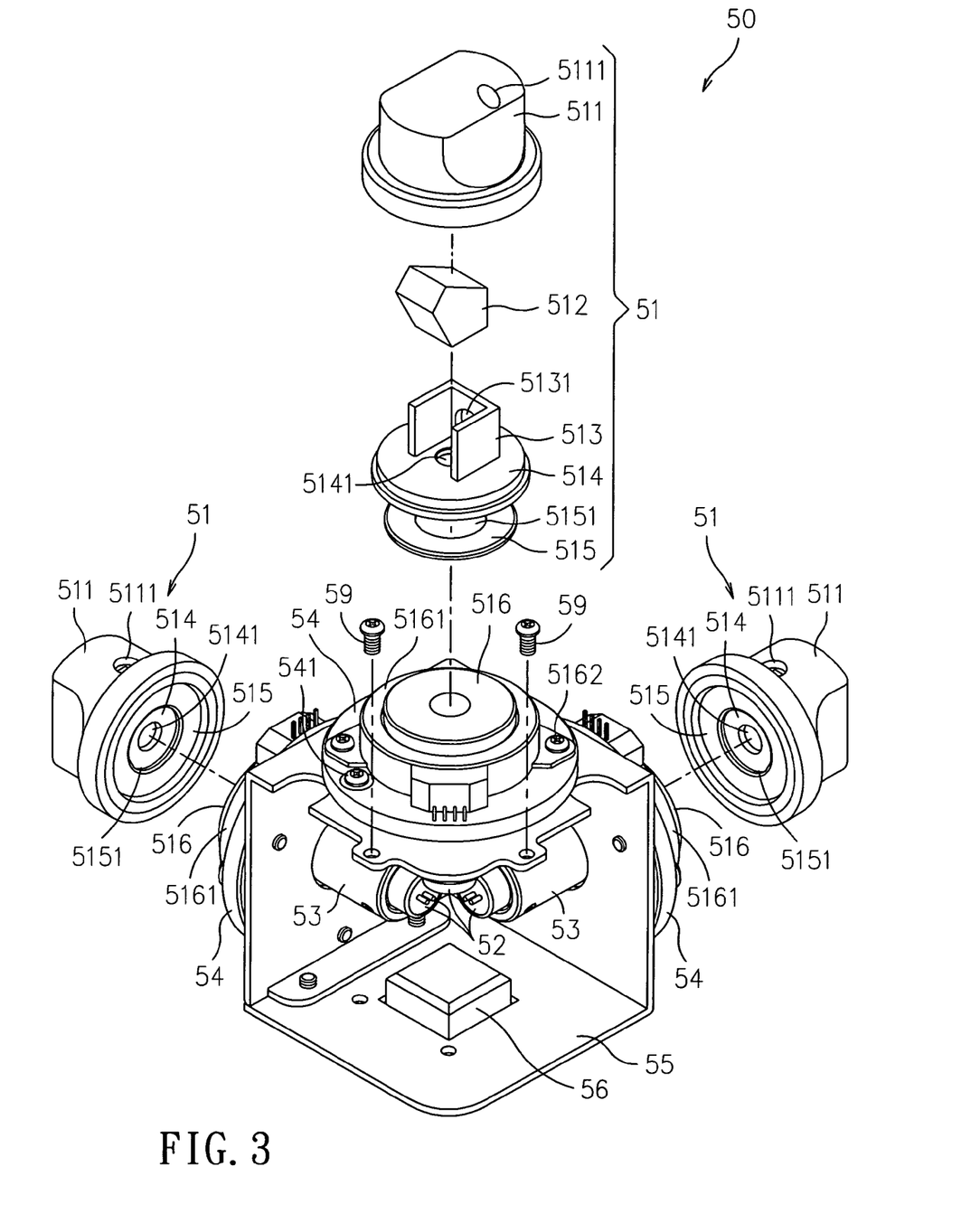
FIG. 3 is an exploded perspective view of the laser indicator of FIG. 2.

FIGS. 2 and 3 illustrate a three-way laser indicator according to the present invention, which has a laser mechanism 5 and an adjusting mechanism 6, with the laser mechanism 5 coupled to the adjusting mechanism 6 by a plurality of screw bolts 59. The laser mechanism 5 has a housing 55 and three laser generators 50. The adjusting mechanism 6 is disposed on a base 7.

Figure 4:
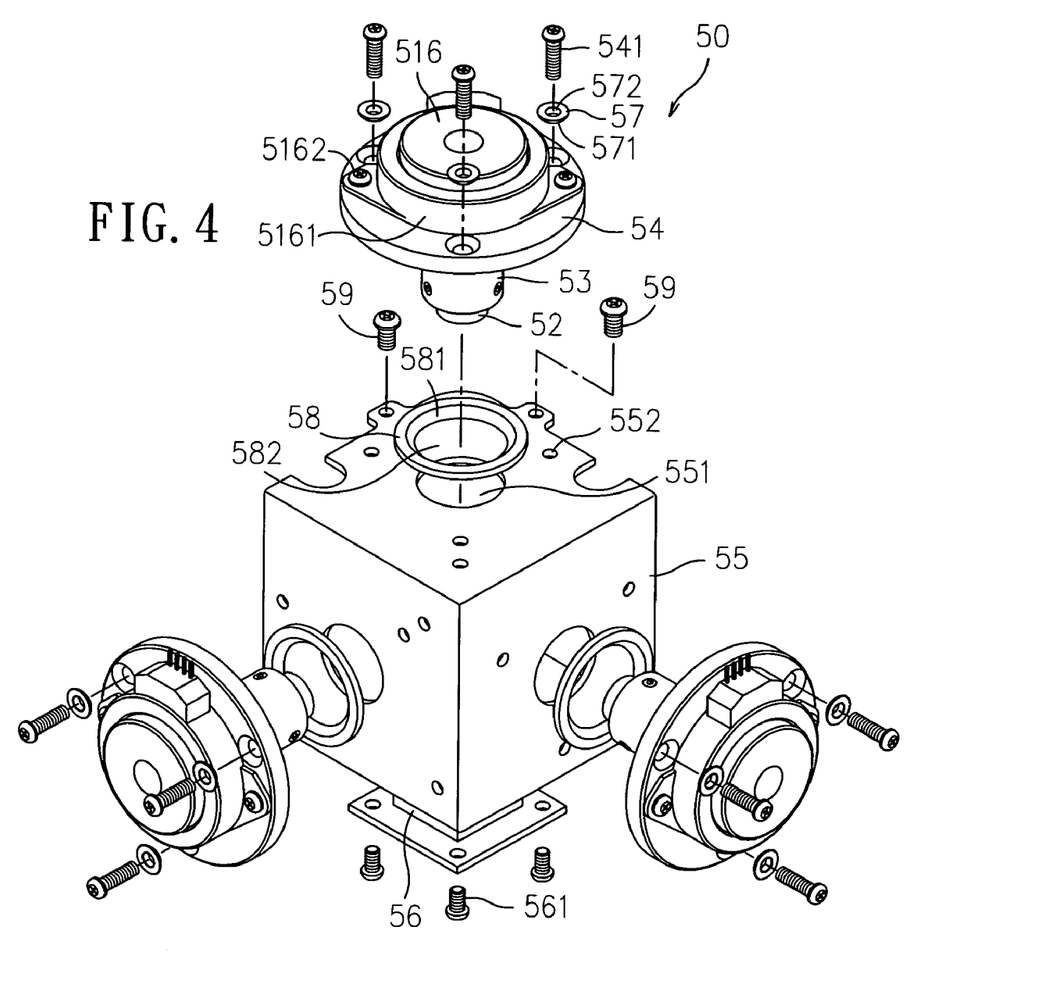
FIG. 4 is another exploded perspective view of the laser indicator of FIG. 2 excluding the prism module.

Referring now to FIGS. 3 and 4, the housing 55 is generally square and has two open sides. Two horizontal and symmetric laser generators 50 are provided on separate (and adjacent) sides of the housing 55, and a laser generator 50 is disposed at the center of the top surface of the housing 55. The construction of the three laser generators 50 is the same, so for simplicity, only the laser generator 50 disposed at the central top surface of the housing 55 is used as an example for illustration herein.

Each laser generator 50 includes a prism module 51 and a laser module 52. The prism module 51 includes an external casing 511, a prism 512, a hood 513, a disk 514, and a bottom chassis 515. The hood 513 is disposed on the disk 514, and the prism 512 is disposed in the hood 513. Each of the external casing 511, the hood 513, the disk 514, and the bottom chassis 515 has a through-section 5111, 5131, 5141, 5151, respectively, that are in communication with each other.

Figure 5:
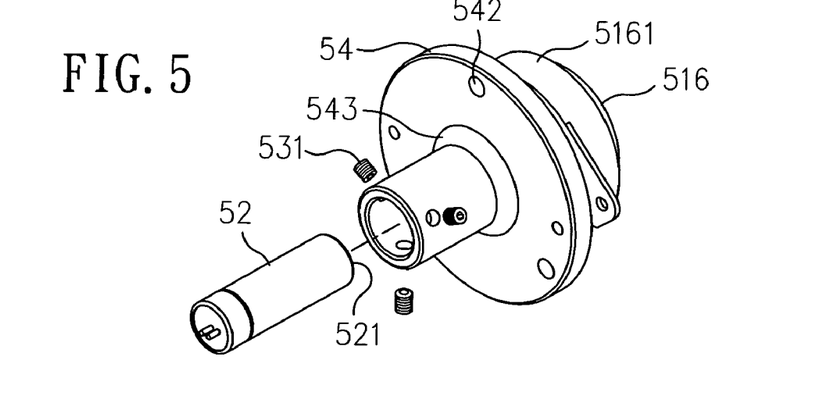
FIG. 5 is an exploded perspective view of the laser module and fixed base of the laser indicator of FIG. 2.

Referring to FIGS. 3–5, the laser module 52 is disposed in a bushing 53, and three adjusting screw bolts 531 pass through the bushing 53 along its axial direction and extend radially into the laser module 52. The adjusting screw bolts 531 can be used to adjust the inclination of the laser module 52 according to techniques known in the art.

Figure 6A:
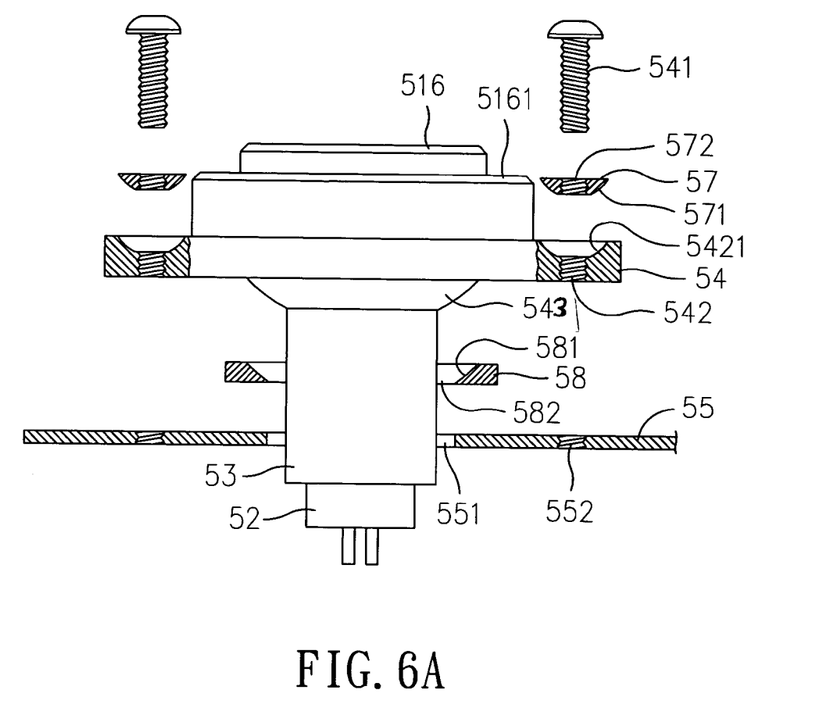
FIGS. 6A and 6B are cross-sectional views of the fine-tune mechanism of the fixed base of the laser indicator of FIG. 2.
Figure 6B:
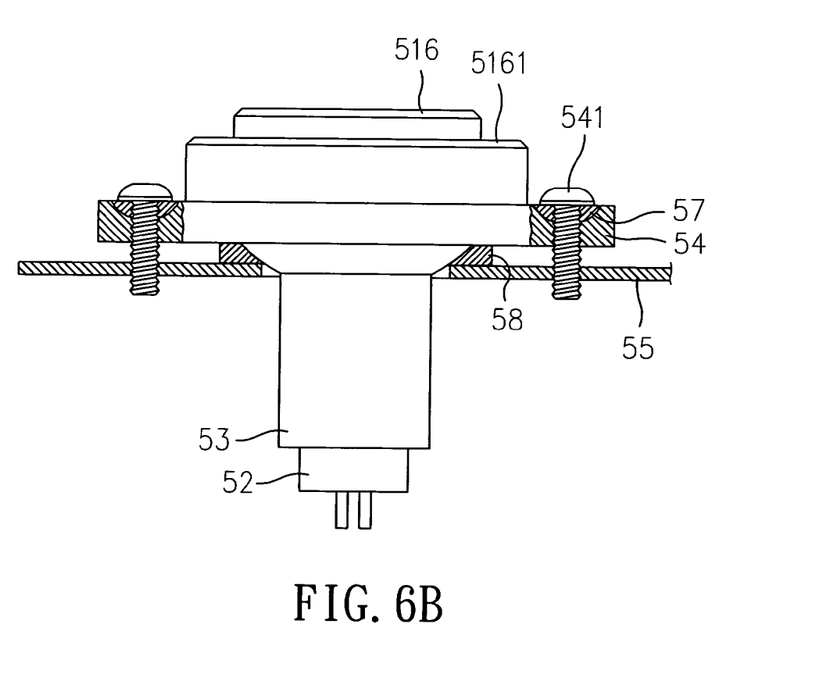

The bushing 53 is disposed at an inner side of a fixed base 54 and passes through the fixed base 54 along its axial direction. The prism module 51 is disposed on an outer side of the fixed base 54. A laser control motor 516 is installed inside a motor base 5161, and between the prism module 51 and the laser module 52. Referring also to FIGS. 6A and 6B, the motor base 5161 is fixed to the fixed base 54 by screws, and the fixed base 54 is mounted to the housing 55 via screw holes 552 by screw bolts 541, so that the prism module 51 is disposed outside the housing 55, and the bushing 53 and the laser module 52 are disposed inside the housing 55. The laser emitting end 521 (see FIG. 5) of the laser module 52 faces towards the bottom chassis 515 of the prism module 51 (as shown in FIG. 3), and the laser beam emitted by the laser module 52 passes through the fixed base 54 and projects through the prism module 51. The laser beam passes through the through-section 5151 of the bottom chassis 515, the through-section 5141 of the disk 514, the through-section 5131 of the hood 513, the prism 512, the through-section 5111 of the external casing 511, and then outside the prism module 51. The control motor 516 of each laser generator 50 can control the beam position independently, thereby lowering the level of difficulty and greatly saving time and manpower for the adjustment.

At least one electronic bubble leveler 56 is disposed at the bottom of the housing 55, and the electronic bubble leveler 56 is coupled to the bottom of the housing 55 by a screw bolt 561. The control motor 516 and the electronic bubble leveler 56 are electrically coupled to the adjusting mechanism 6. The structure of the adjusting mechanism will be described below.

Each laser generator 50 has an adjuster and tightener, as best illustrated in FIGS. 4, 5, 6A and 6B. A spacer 57 is disposed at a screw hole 542 of the fixed base 54, and a convex surface 571 is formed on the side of the spacer 57 facing the fixed base 54. The screw hole 542 of the fixed base 54 has a corresponding concave surface 5421. In addition, a convex circular structure 543 is disposed at the joint of the fixed base 54 and the bushing 53 on a surface of the fixed base 54 facing the housing 55. A ring member 58 is disposed around the exterior of the bushing 53, and between the fixed base 54 and the housing 55. The ring member 58 has a concave section 581 disposed thereon at a position that is aligned with the convex circular structure 543.

The convex surface 571 and the concave surface 5421 have substantially the same curvature, and the convex circular structure 543 and the concave section 581 have substantially the same curvature, as best shown in FIGS. 6A and 6B. The bushing 53 passes through a through-section 582 at the center of the ring member 58 and the through-section 551 of the housing 55, such that the convex circular structure 543 attaches to the concave section 581 on the ring member 58. The screw bolt 541 is sequentially threaded through the screw hole 572 of the spacer 57, the screw hole 542 of the fixed base 54, and a screw hole 552 of the housing 55, to mount the fixed base 54 onto the housing 55. The angle of the fixed base 54 can be adjusted by adjusting the threading of the screw bolts 541 because of the alignment of the convex surface 571 of the spacer 57 with the concave surface 5421 of the fixed base 54, and the alignment of the convex circular structure 543 of the fixed base 54 with the concave section 581 of the ring member 58. In the meantime, the convex surface 571 and the convex circular surface of the convex circular structure 543 present the feature of precisely matching the entire circumference such that the screw bolts 541 can be secured to enhance the tight attachment between the fixed base 54 and the housing 55.

Figure 7:
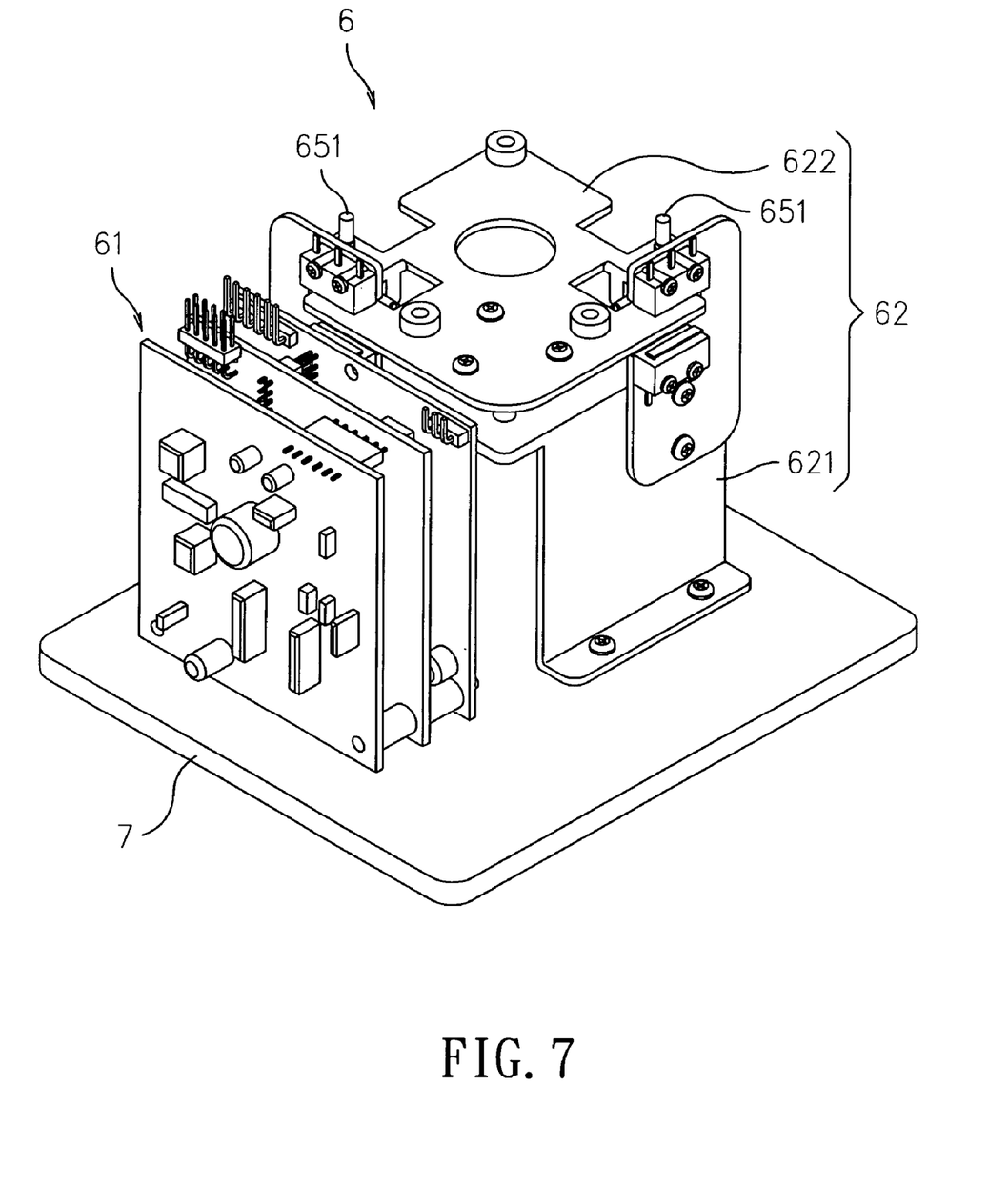
FIG. 7 is a perspective view of the fine-tune mechanism of the laser indicator of FIG. 2.
Figure 8:
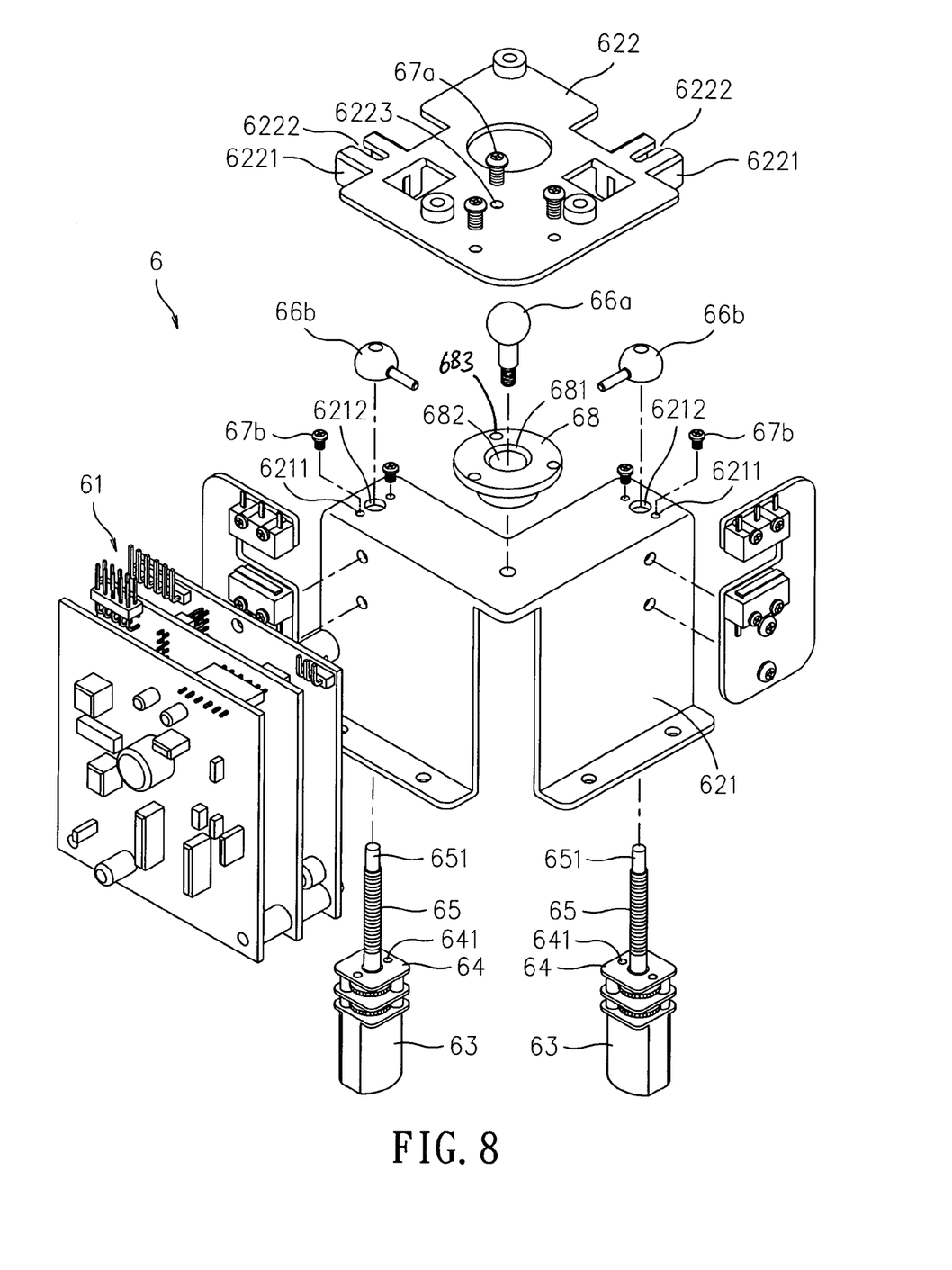
FIG. 8 is an exploded perspective view of the fine-tune mechanism of FIGS. 6A–6B.

FIGS. 7 and 8 illustrate the adjusting mechanism 6. The adjusting mechanism 6 has a control circuit module 61 for controlling the action of the entire laser indicator. The adjusting mechanism 6 includes a frame 62 having a fixed frame 621 and an adjusting frame 622. The fixed frame 621 is disposed on a base 7 (see FIG. 2), and the adjusting frame 622 is disposed at the top of the fixed frame 621. The control circuit module 61 is connected to two level control motors 63. Each level control motor 63 is disposed inside the fixed frame 621 and is coupled to a gear module 64 and a screw rod 65. The screw rod 65 passes through a corresponding through-hole 6212 of the fixed frame 621 and has a sphere 66a or 66b.

The sphere 66b is used at both symmetrical sides of the fixed frame 621, and presses against an internal bottom of a U-shaped hood 6221 disposed at a position corresponding to the adjusting frame 622, with the top 651 of the screw rod 65 passing through the groove 6222 of the N-shaped hood 6221. The screw rod 65, the gear module 64, and the level control motor 63 are fixed to the fixed frame 621 via screw bolts 67b securing the screw holes 6211 of the fixed frame 621 and the screw holes 641 of the gear module 64.

The sphere 66a at the center of the fixed frame 621 is connected inside the through-section 682 at the center of an adjustment support 68, and a concave section 681 having a curvature corresponding to the curvature of the sphere 66a is disposed at the contact position of the inner circumference of the through-section 682 with the bottom of the sphere 66a. By securing screw bolts 67a through screw holes 6223 of the adjusting frame 622 and screw holes 683 of the support 68, the sphere 66a and the support 68 can be positioned between the fixed frame 621 and the adjusting frame 622. The top of the sphere 66a presses against the bottom of the adjusting frame 622 to allow for adjustment of the level of the adjusting frame 622.

Figure 9:
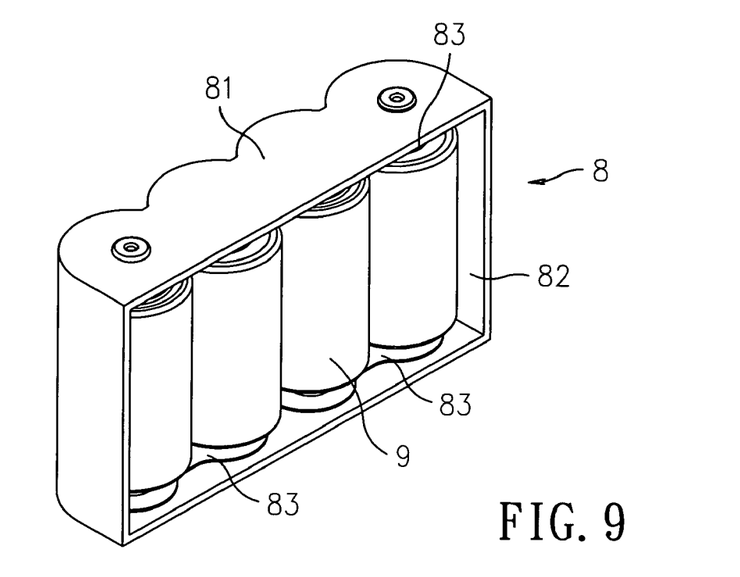
FIG. 9 is a perspective view of the battery module of the present invention.
Figure 10:
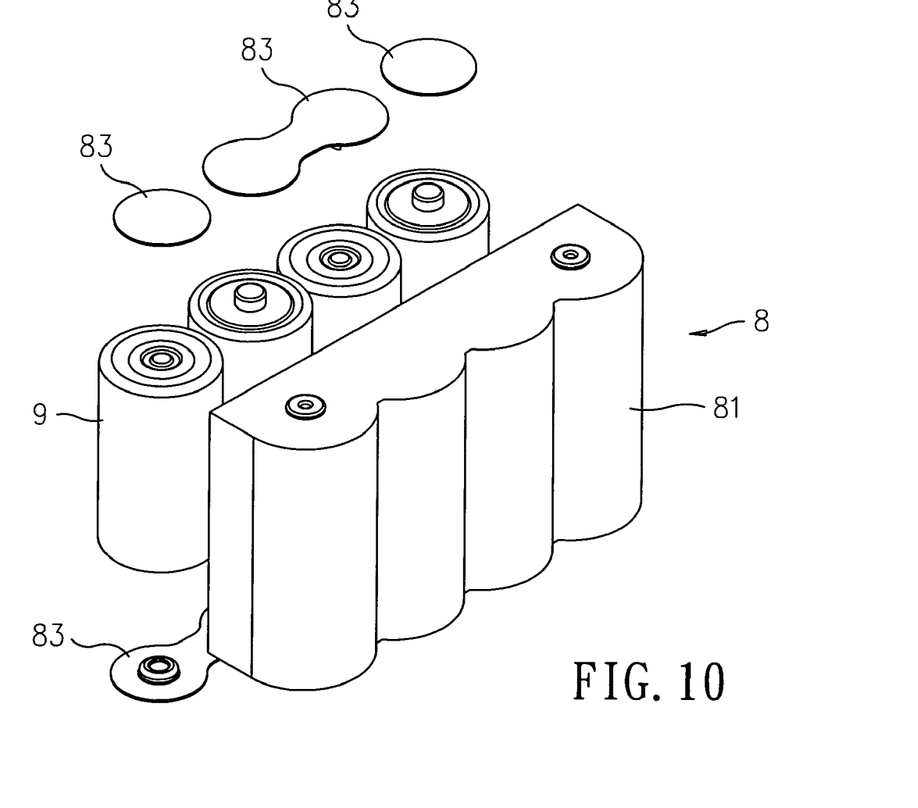
FIG. 10 is an exploded perspective view of the battery module of the present invention.
Figure 11:
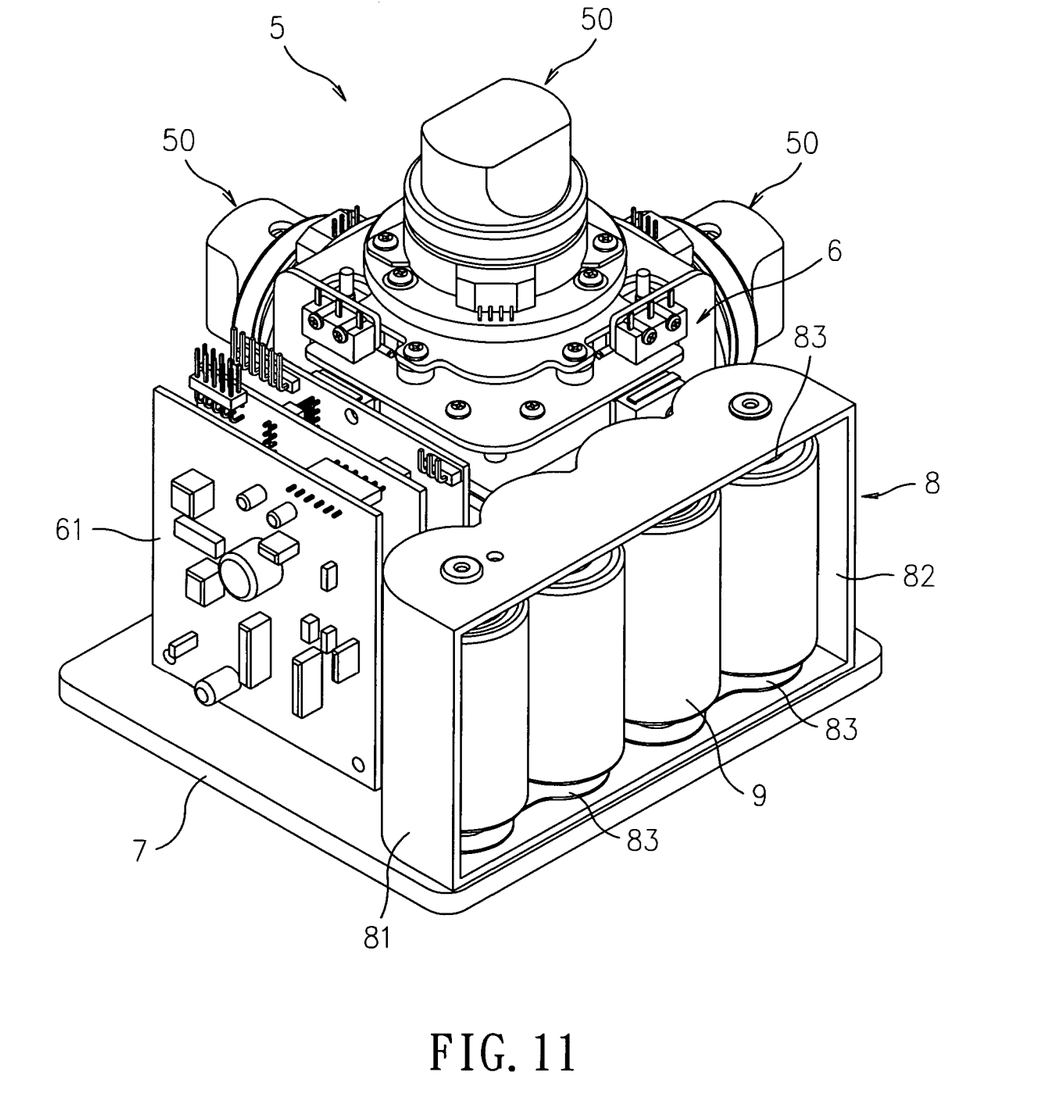
FIG. 11 is a perspective view of the three-way laser indicator of FIG. 2 together with the battery module of FIG. 9.

The control circuit module 61 is connected to a battery module 8, which is shown in FIGS. 9–11. The battery module 8 is disposed at an appropriate position of the base 7 and has a casing 81. The casing 81 includes a compartment 82 for accommodating one or more batteries 9. An electrically conductive plate 83 is disposed at an appropriate position of the casing 81, such that the electrically conductive plate 83 is electrically connected to the control circuit module 61. When the batteries 9 are installed into the casing 81, the power of the batteries 9 are conducted to the control circuit module 61 through the electrically conductive plate 83. The power is supplied by the batteries 9, thereby requiring no external power supply and therefore improving the portability of the laser indicator of the present invention. Thus, the laser indicator of the present invention can even be used outdoors or at locations where a power supply is not available. The control circuit module 61 of the present invention can even have a control circuit connected to an AC power supply, and adopt a rechargeable battery for the batteries 9. If the laser indicator is then connected to an AC power supply, the batteries 9 will be charged at the same time.

It is noteworthy that conventional three-way level laser measuring instruments are not generally used mainly because the focus point of the laser generator resides within the vicinity of the laser generator (e.g., see FIG. 1C). Therefore, it is not capable of performing a three-way measurement. The laser indicator of the present invention not only provides a focus point outside the vicinity of the laser generator 50, but also allows for a three-way level laser measurement. Further, each laser generator 50 has an independent control motor 516 for adjusting the beam position of each laser generator 50 separately, and the fixed base 54 of each laser generator 50 has a fine-tune mechanism for adjusting the angle of the fixed base 54 and for enhancing the tight attachment between the fixed base 54 and the housing 55. The laser indicator of the present invention also has a pleasant appearance.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A laser indicator, comprising:
   a laser mechanism having a housing and three laser generators generating laser beams perpendicular to each other, with each laser generator including:
   a prism module having a prism, a hood, a fixed base and a bottom chassis disposed in an external casing, with the prism disposed inside the hood, and with each of the bottom chassis, base, hood, and external casing having an interconnected through-section;
   a bushing; and
   a laser module retained inside the bushing and having an emitting end facing the prism module;

wherein each of the three laser generators is electrically coupled to a separate laser control motor for independent control of the beam of the corresponding laser generator; and
   wherein each laser generator further includes a laser generator adjuster and tightener, comprising:
   a fixed base of the prism module having a screw hole that has a concave surface;
   a spacer disposed at the screw hole of the fixed base, the spacer having a convex surface corresponding to the concave surface of the screw hole;
   a convex circular structure positioned at a joint of the fixed base and the bushing; and
   a ring member extending around the bushing, the ring member having a concave section corresponding to the convex circular structure.

2. The laser indicator of claim 1, further including an adjusting mechanism including:
   a control circuit module;
   a frame having an adjustment support associated therewith; and
   a plurality of level control motors disposed in the frame.

3. The laser indicator of claim 2, wherein the frame has a fixed frame and an adjusting frame disposed at the top of the fixed frame, and wherein each level control motor includes:
   a gear module;
   a sphere abutting the adjusting frame; and
   a screw rod passing through the fixed frame to connect to the sphere.

4. The laser indicator of claim 2, wherein the control circuit module is coupled to a battery module.

5. The laser indicator of claim 4, wherein the battery module includes:
   a casing having a compartment for accommodating batteries; and
   a conductive plate disposed in the casing and electrically coupled to the control circuit module.

6. The laser indicator of claim 1, wherein the laser mechanism further includes at least one adjusting screw that extends through the bushing into the laser module to adjust the inclination of the laser module.

7. The laser indicator of claim 1, further including at least one electronic bubble leveler disposed at the bottom of the housing.

8. The laser indicator of claim 1, wherein the bushing is disposed on one side of the fixed base and passes through the fixed base, with the prism module disposed on another side of the fixed base.

9. The laser indicator of claim 1, wherein the laser control motor is disposed between the laser module and the prism module, such that the prism module is disposed outside the housing, and the bushing and the laser module are disposed inside the housing.

10. A laser indicator comprising a frame and a laser mechanism supported by the frame, the laser mechanism having three laser generators generating laser beams perpendicular to each other, with each laser generator including:
    a prism module having a prism;
    a bushing;
    a laser module retained inside the bushing and having an emitting end facing the prism module; and
    a laser generator adjuster and tightener, comprising:
    (a) a fixed base of the prism module having a screw hole that has a concave surface;

(b) a spacer disposed at the screw hole of the fixed base, the spacer having a convex surface corresponding to the concave surface of the screw hole;
(c) a convex circular structure positioned at a joint of the fixed base and the bushing; and
(d) a ring member extending around the bushing, the ring member having a concave section corresponding to the convex circular structure.

11. The laser indicator of claim 10, wherein:
(a1) the fixed base of the prism module has a plurality of screw holes, each having a concave surface;
(b1) a plurality of spacers, with each spacer disposed at a corresponding screw hole of the fixed base, each spacer having a convex surface corresponding to the concave surface of the corresponding screw hole.

12. A laser indicator, comprising:
a. a laser mechanism having a housing and three laser generators generating laser beams perpendicular to each other;
b. an adjusting mechanism including:
  a control circuit module;
  a frame having a fixed frame, an adjusting frame disposed at the top of the fixed frame, and an adjustment support associated with the frame; and
  a level control motor disposed in the frame and including:
    i. a gear module;
    ii. a sphere abutting the adjusting frame; and
    iii. a screw rod passing through the fixed frame to connect to the sphere; and
c. wherein each laser generator further includes:
  a prism module having a prism;
  a bushing;
  a laser module retained inside the bushing and having an emitting end facing the prism module; and
  a laser generator adjuster and tightener, comprising:
    (i) a fixed base of the prism module having a screw hole that has a concave surface;
    (ii) a spacer disposed at the screw hole of the fixed base, the spacer having a convex surface corresponding to the concave surface of the screw hole;
    (iii) a convex circular structure positioned at a joint of the fixed base and the bushing; and
    (iv) a ring member extending around the bushing, the ring member having a concave section corresponding to the convex circular structure.

13. The laser indicator of claim 12, wherein the adjustment support is positioned at the center of the fixed frame, and has a concave section that receives the sphere of the level control motor.

* * * * *